United States Patent
Asterlin et al.

(10) Patent No.: US 10,226,814 B2
(45) Date of Patent: Mar. 12, 2019

(54) CAST COMPONENT HAVING CORNER RADIUS TO REDUCE RECRYSTALLIZATION

(71) Applicant: United Technologies Corporation, Hartford, CT (US)

(72) Inventors: Max Asterlin, Vernon, CT (US); Jeffrey S. Beattie, South Glastonbury, CT (US); John R. Gunn, Simsbury, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 583 days.

(21) Appl. No.: 14/769,803

(22) PCT Filed: Mar. 11, 2014

(86) PCT No.: PCT/US2014/022990
§ 371 (c)(1),
(2) Date: Aug. 22, 2015

(87) PCT Pub. No.: WO2014/150342
PCT Pub. Date: Sep. 25, 2014

(65) Prior Publication Data
US 2016/0001356 A1    Jan. 7, 2016

Related U.S. Application Data

(60) Provisional application No. 61/786,996, filed on Mar. 15, 2013.

(51) Int. Cl.
*B22D 15/00* (2006.01)
*B22D 27/04* (2006.01)
(Continued)

(52) U.S. Cl.
CPC ............... *B22D 15/00* (2013.01); *B22C 9/10* (2013.01); *B22D 25/02* (2013.01); *B22D 27/04* (2013.01);
(Continued)

(58) Field of Classification Search
CPC .......... B22C 9/10; B22D 15/00; B22D 25/02; B22D 27/04; B22D 27/045; C30B 11/00;
(Continued)

(56) References Cited

U.S. PATENT DOCUMENTS

| 4,580,613 A | 4/1986 | Miller et al. |
| 5,598,968 A | 2/1997 | Schaeffer et al. |

(Continued)

FOREIGN PATENT DOCUMENTS

| EP | 2364796 | 11/1999 |
| EP | 1467065 | 10/2004 |

(Continued)

OTHER PUBLICATIONS

The International Search Report and Written Opinion for PCT Application No. PCT/US2014/022990, dated Jun. 24, 2014.

(Continued)

*Primary Examiner* — Mark Laurenzi
*Assistant Examiner* — Paul Thiede
(74) *Attorney, Agent, or Firm* — Carlson, Gaskey & Olds, P.C.

(57) ABSTRACT

A cast component includes a cast body that has a single crystal microstructure and an internal corner bounding an internal cavity. The single crystal microstructure defines a critical internal residual stress with respect to investment casting of the cast body using a refractory metal core beyond which the single crystal microstructure recrystallizes under a predetermined condition. The internal corner has a corner radius that is greater than a critical corner radius below (Continued)

which an amount of internal residual stress in the single crystal microstructure exceeds the critical internal residual stress. The internal cavity includes a cross section less than about 20 mils near the corner radius.

18 Claims, 1 Drawing Sheet

(51) Int. Cl.

| | | |
|---|---|---|
| B22C 9/10 | (2006.01) | |
| C30B 29/52 | (2006.01) | |
| B22D 25/02 | (2006.01) | |
| F01D 5/18 | (2006.01) | |
| F01D 9/04 | (2006.01) | |
| C30B 11/00 | (2006.01) | |
| F01D 5/28 | (2006.01) | |
| F02C 3/04 | (2006.01) | |

(52) U.S. Cl.
CPC ............ *B22D 27/045* (2013.01); *C30B 11/00* (2013.01); *C30B 29/52* (2013.01); *F01D 5/18* (2013.01); *F01D 5/187* (2013.01); *F01D 5/282* (2013.01); *F01D 9/041* (2013.01); *F02C 3/04* (2013.01); *F05D 2220/30* (2013.01); *F05D 2230/21* (2013.01); *F05D 2230/211* (2013.01); *F05D 2260/20* (2013.01); *F05D 2260/204* (2013.01); *F05D 2300/607* (2013.01); *F05D 2300/608* (2013.01); *Y02T 50/676* (2013.01)

(58) Field of Classification Search
CPC . C30B 29/52; F01D 5/18; F01D 5/187; F01D 5/282; F01D 9/041; F02C 3/04; F05D 2220/30; F05D 2230/21; F05D 2230/211; F05D 2260/20; F05D 2260/204; F05D 2300/607; F05D 2300/608; Y02T 50/676; B23P 6/007

USPC .......................................... 415/200; 148/641
See application file for complete search history.

(56) References Cited

U.S. PATENT DOCUMENTS

| | | |
|---|---|---|
| 5,649,280 A | 7/1997 | Blankenship et al. |
| 5,977,007 A | 11/1999 | Lassow et al. |
| 6,331,217 B1 | 12/2001 | Burke et al. |
| 6,474,946 B2 | 11/2002 | Kildea |
| 6,711,928 B1 | 3/2004 | Easterbrook |
| 7,014,424 B2 | 3/2006 | Cunha et al. |
| 7,115,175 B2 | 10/2006 | DeLuca et al. |
| 7,478,994 B2 | 1/2009 | Cunha et al. |
| 7,553,131 B2 | 6/2009 | Cunha et al. |
| 7,763,129 B2 | 7/2010 | Mourer et al. |
| 7,875,135 B2 * | 1/2011 | Kelly ................... B23P 6/007 148/639 |
| 8,128,375 B2 | 3/2012 | Girard et al. |
| 2004/0007296 A1 | 1/2004 | Mihalisin et al. |
| 2006/0170668 A1 | 8/2006 | Hsieh |
| 2008/0063533 A1 | 3/2008 | Boyle et al. |

FOREIGN PATENT DOCUMENTS

| | | |
|---|---|---|
| EP | 1715139 | 10/2006 |
| EP | 1813776 | 8/2007 |
| EP | 2364796 | 9/2011 |
| GB | 1523922 | 9/1978 |
| GB | 2270718 | 3/1994 |
| JP | 58202948 | 11/1983 |
| JP | 2000319769 | 11/2000 |
| WO | 2007038378 | 4/2007 |

OTHER PUBLICATIONS

International Preliminary Report on Patentability for PCT Application No. PCT/US2014/022990 dated Sep. 24, 2015.
Supplemental European Search Report for European Patent Application No. 14767376 completed Oct. 7, 2016.

* cited by examiner

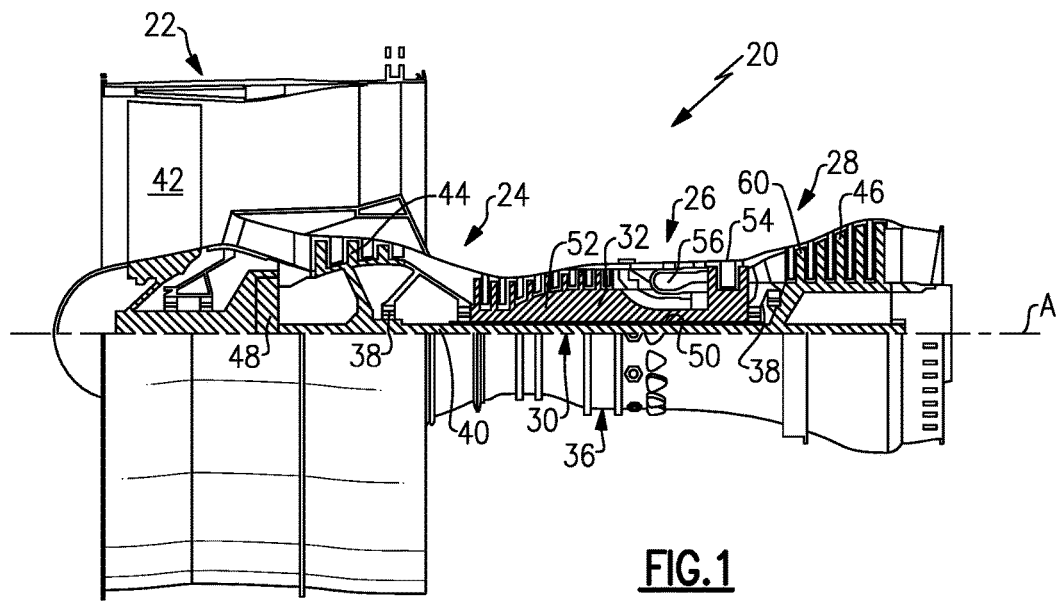
FIG.1
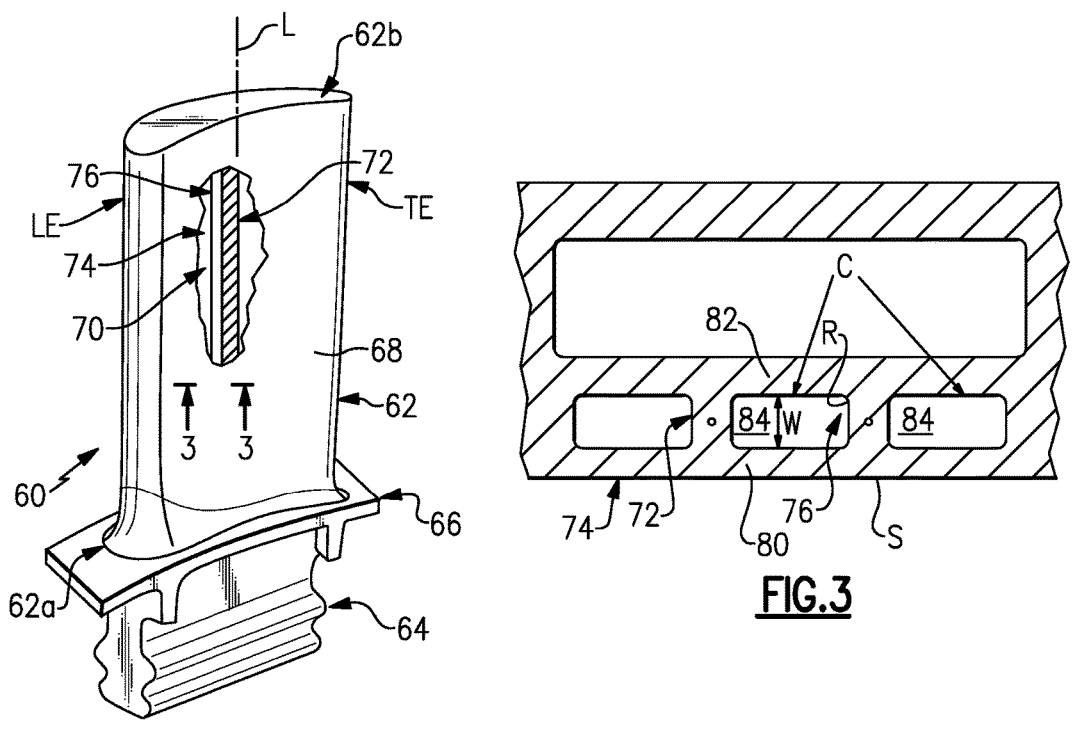
FIG.2
FIG.3

2

CAST COMPONENT HAVING CORNER RADIUS TO REDUCE RECRYSTALLIZATION

BACKGROUND

This disclosure relates to recrystallization in cast components.

Machine components, such as gas turbine engine airfoils, can be cast from a superalloy material. For instance, in investment casting, a ceramic or refractory metal core is arranged in a mold and coated in a wax material, which provides a desired shape. The wax material is then coated with ceramic slurry that is hardened into a shell. The wax is melted out of the shell and the remaining cavity is then filled with metal to provide the component. The core is then removed, leaving internal passages within the component.

SUMMARY

A cast component according to an example of the present disclosure includes a cast body having a single crystal microstructure and an internal corner bounding an internal cavity. The single crystal microstructure defines a critical internal residual stress with respect to investment casting of the cast body using a refractory metal core beyond which the single crystal microstructure recrystallizes under a predetermined condition. The internal corner defines a corner radius (R) that is greater than a critical corner radius below which an amount of internal residual stress in the single crystal microstructure exceeds the critical internal residual stress. The internal cavity includes a cross section of less than about 20 mils near the corner radius.

In a further embodiment of any of the foregoing embodiments, the internal cavity is a micropassage with cross section less than about 15 mils.

In a further embodiment of any of the foregoing embodiments, the micropassage is embedded within an exterior wall of the cast body.

In a further embodiment of any of the foregoing embodiments, the cast body is an airfoil, and the exterior wall is a suction side wall or a pressure side wall of the airfoil.

In a further embodiment of any of the foregoing embodiments, the micropassage has a cross-section taken perpendicular to a longitudinal direction of the cast body, the cross-section having a maximum dimension width (W) such that a ratio of the maximum dimension width (W) to the corner radius (R) is no greater than 10:1 (ten to one).

In a further embodiment of any of the foregoing embodiments, the internal cavity has a cross-section taken perpendicular to a longitudinal direction of the cast body, the cross-section having a maximum dimension width (W) such that a ratio of the corner radius (R) to the maximum dimension width (W) is at least 1:10 (one to ten).

In a further embodiment of any of the foregoing embodiments, the internal corner is between a rib and an exterior wall of the cast body.

In a further embodiment of any of the foregoing embodiments, the cast body is a nickel-based alloy.

A turbine engine according to an example of the present disclosure includes optionally, a fan, a compressor section, a combustor in fluid communication with the compressor section, and a turbine section in fluid communication with the combustor. The turbine section includes airfoil cast component that has a cast body having a single crystal microstructure and an internal corner bounding an internal cavity. The single crystal microstructure defines a critical internal residual stress with respect to investment casting of the cast body using a refractory metal core beyond which the single crystal microstructure recrystallizes under a predetermined condition. The internal corner defines a corner radius (R) that is greater than a critical corner radius below which an amount of internal residual stress in the single crystal microstructure exceeds the critical internal residual stress. The internal passage has a cross section less than about 20 mils.

A method of controlling recrystallization in a cast component according to an example of the present disclosure includes limiting recrystallization in a cast body having a single crystal microstructure by establishing an internal corner that bounds an internal cavity in the cast body to have a corner radius (R) that is greater than a critical corner radius with respect to investment casting of the cast body using a refractory metal core below which an amount of internal residual stress in the single crystal microstructure exceeds a critical internal residual stress from casting beyond which the single crystal microstructure recrystallizes under a predetermined condition.

In a further embodiment of any of the foregoing embodiments, the internal cavity is a micropassage.

In a further embodiment of any of the foregoing embodiments, the cast body is an airfoil, and the micropassage is embedded within an exterior wall of the airfoil.

A further embodiment of any of the foregoing embodiments includes forming the internal cavity using a refractory metal core.

In a further embodiment of any of the foregoing embodiments, the refractory metal core includes a portion having a cross section less than about 15 mils near the corner radius.

BRIEF DESCRIPTION OF THE DRAWINGS

The various features and advantages of the present disclosure will become apparent to those skilled in the art from the following detailed description. The drawings that accompany the detailed description can be briefly described as follows.

FIG. 1 shows an example gas turbine engine.

FIG. 2 shows an example airfoil used in the gas turbine engine of FIG. 1.

FIG. 3 schematically shows a corner between a rib and a wall.

DETAILED DESCRIPTION

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown) among other systems or features. The fan section 22 drives air along a bypass flowpath while the compressor section 24 drives air along a core flowpath for compression and communication into the combustor section 26 then expansion through the turbine section 28. Although depicted as a turbofan gas turbine engine in the disclosed non-limiting embodiment, it should be understood that the concepts described herein are not limited to use with turbofans as the teachings may be applied to other types of turbine engines including three-spool architectures.

The engine 20 generally includes a first spool 30 and a second spool 32 mounted for rotation about an engine central axis A relative to an engine static structure 36 via several bearing systems 38. It should be understood that various bearing systems 38 at various locations may alternatively or additionally be provided.

The first spool 30 generally includes a first shaft 40 that interconnects a fan 42, a first compressor 44 and a first turbine 46. The first shaft 40 is connected to the fan 42 through a gear assembly of a fan drive gear system 48 to drive the fan 42 at a lower speed than the first spool 30. The second spool 32 includes a second shaft 50 that interconnects a second compressor 52 and second turbine 54. The first spool 30 runs at a relatively lower pressure than the second spool 32. It is to be understood that "low pressure" and "high pressure" or variations thereof as used herein are relative terms indicating that the high pressure is greater than the low pressure. An annular combustor 56 is arranged between the second compressor 52 and the second turbine 54. The first shaft 40 and the second shaft 50 are concentric and rotate via bearing systems 38 about the engine central axis A which is collinear with their longitudinal axes.

The core airflow is compressed by the first compressor 44 then the second compressor 52, mixed and burned with fuel in the annular combustor 56, then expanded over the second turbine 54 and first turbine 46. The first turbine 46 and the second turbine 54 rotationally drive, respectively, the first spool 30 and the second spool 32 in response to the expansion.

The engine 20 is a high-bypass geared aircraft engine that has a bypass ratio that is greater than about six (6), with an example embodiment being greater than ten (10), the gear assembly of the fan drive gear system 48 is an epicyclic gear train, such as a planetary gear system or other gear system, with a gear reduction ratio of greater than about 2.3:1 and the first turbine 46 has a pressure ratio that is greater than about five (5). The first turbine 46 pressure ratio is pressure measured prior to inlet of first turbine 46 as related to the pressure at the outlet of the first turbine 46 prior to an exhaust nozzle. The first turbine 46 has a maximum rotor diameter and the fan 42 has a fan diameter such that a ratio of the maximum rotor diameter divided by the fan diameter is less than 0.6. It should be understood, however, that the above parameters are only exemplary.

A significant amount of thrust is provided by the bypass flow B due to the high bypass ratio. The fan section 22 of the engine 20 is designed for a particular flight condition—typically cruise at about 0.8 Mach and about 35,000 feet. The flight condition of 0.8 Mach and 35,000 ft, with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(Tram\ °\ R)/(518.7°\ R)]^{0.5}$. The "Low corrected fan tip speed" as disclosed herein according to one non-limiting embodiment is less than about 1150 ft/second.

The turbine section 28 of the engine 20 includes a plurality of cast components 60, such as rotatable blades or static vanes. The cast components 60 are made of a superalloy material, such as a nickel- or cobalt-based alloy. The cast components 60 are cast in an investment casting process to provide a single-crystal microstructure and to form a relatively complex shape, with internal cooling passages. Upon cooling in the investment casting process, internal residual stresses or strains can develop. In particular, relatively high residual strains can develop when using a refractory metal core to form internal passages in the components 60. As an example, ceramic cores are designed with internal porosity to be "crushable" under the strains generated during the cooling and thus function to alleviate strain on the cast component when the ceramic core crushes. Refractory metal cores, however, are non-crushable and can therefore generate relatively high residual strain in cast components. Refractory metals can include molybdenum, tantalum, niobium, tungsten, and alloys thereof, further examples of which can be found in U.S. Pat. No. 6,637,500 to Shah et. al., incorporated herein by reference. The term "internal residual stress" will be used herein, but it is to be understood that "internal residual strain" is equally applicable.

Locations of internal residual stresses from casting with a refractory metal core can serve as nucleation sites for recrystallization of a superalloy material during subsequent heat cycles. Misoriented recrystallized grains debit mechanical properties and can serve as crack initiation sites. A potential solution to reduce recrystallization is to heat treat a component to relieve residual internal stress. Heat treatment, although beneficial to reducing recrystallization, can affect strength and other properties of a component, such as an airfoil, as well as add cost. As will be explained in further detail below, the cast component 60 disclosed herein includes features for reducing as-cast internal residual stress in investment casting processes that utilize a refractory metal core such that recrystallization is eliminated or reduced and stress-relieving heat treatment is unnecessary.

FIG. 2 illustrates one of the cast components 60. In this example, the cast component 60 is a rotatable gas turbine engine turbine blade, although this disclosure is not limited to blades and can be applied to vanes or other cast components for machinery. The cast component 60 includes an airfoil section 62, a root section 64 and a platform section 66. At least the airfoil section 62 constitutes a cast body 68. In this example, the airfoil section 62, the root section 64 and the platform section 66 are cast as a unitary body.

The cast component 60 extends generally along a longitudinal axis L that, when arranged in the engine 20, is perpendicular to the central engine axis A. The airfoil section 62 generally extends between a leading edge LE and a trailing edge TE, a base 62a at the platform section 66 and a tip end 62b.

As described above, the cast component 60 can be fabricated using investment casting to provide a relatively complex geometry. In this regard, the cast component 60 includes one or more internal cooling passages 70 (shown by cutaway in FIG. 2) that generally extend adjacent one or more ribs 72 within the airfoil section 62. In this example, the rib 72 meets an adjacent wall 74 at an internal corner 76. The internal cooling passages 70 are formed using a refractory metal core, as discussed above, in the investment casting process.

Referring also to FIG. 3, which shows a sectioned view through several ribs 72 and the adjacent wall 74 along with the corner 76, the single crystal microstructure of the cast body 68 defines a critical internal residual stress with respect to investment casting of the cast body 68 using a refractory metal core beyond which the single crystal microstructure recrystallizes under a predetermined condition. For example, the predetermined condition is greater than 5% strain locally at the internal corner 76.

In this example, the internal corner 76 has a corner radius R (of curvature) that is greater than a critical corner radius below which an amount of internal residual stress in the single crystal microstructure exceeds the critical internal residual stress. Thus, the internal corner 76 has the corner radius R that is large enough such that the internal residual stress does not exceed the critical internal residual stress level and thus, recrystallization is reduced or eliminated. By reducing or eliminating recrystallization through the design of such internal corners 76 rather than using a subsequent heat treatment after casting, heat treatments can be eliminated from the fabrication process, reducing cost. Additionally, unlike the heat treatments, which can affect other properties of an airfoil, the approach of designing one or more corner radii to be larger than a critical corner radii has little or no effect on other properties of the cast component 60.

As a further example, the rib 72 and wall 74 are joined with adjacent ribs 72 and walls 80 and 82. The rib 72 and walls 80/82 bound a passage 84. In this example, the wall 80 carries an exterior surface, S, of the cast component, such as a suction side surface or a pressure side surface. In a further example, the passage 84 is a micropassage, e.g., having a cross section that has a maximum dimension width (W) of less than about 20 mils across. In yet a further example, the passage 84 is a micropassage having a cross section that has a maximum dimension width (W) which is less than about 15 mils across.

The use of the refractory metal core in the investment casting process permits smaller and more complex structures to be formed, such as the micropasage. However, smaller and more complex structures generally have smaller corner radii and, coupled with the relatively high strains that can be generated with the use of a refractory metal core, can contribute to high internal residual stresses that can lead to recrystallization. The corner 76 of the passage 84 has the corner radius R that is greater than the critical corner radius below which an amount of internal residual stress in the single crystal microstructure exceeds the critical internal residual stress. Thus, even though the micropassage is relatively small, the corner radius is designed to be greater than the critical corner radii to avoid or reduce internal residual stresses and, therefore, reduce or eliminate recrystallization.

In one example, the corner radius R is selected in correspondence with a maximum dimension width (W) of the cross-section of the passage 84. For instance, a ratio of the maximum dimension width (W) of the passage 84 to the corner radius (R) is no greater than 10:1 (ten to one). Put another way, a ratio of the corner radius (R) to the maximum dimension width (W) of the passage 84 is at least 1:10 (one to ten).

It is to be understood that the critical corner radius and the critical internal residual stress from casting using a refractory metal core can vary somewhat with design and composition of the superalloy material used. The examples herein serve as guidance for selection and, given these examples, one of ordinary skill in the art will be able to determine the critical internal residual stress, the critical corner radius and thus a corner radius R that should be used in their particular design when investment casting using a refractory metal core. For example, the critical internal residual stress can be determined by casting sample parts, or even non-parts, subjecting the samples to the predetermined condition and then conducting a microstructural evaluation using microscopy.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A cast component comprising:
a cast body having a single crystal micro structure and an internal corner bounding an internal cavity wherein a cross section (C) of the internal cavity has a maximum dimension width (W) that is less than about 20 mils, the single crystal microstructure defining a critical internal residual stress with respect to investment casting of the cast body using a refractory metal core beyond which the single crystal microstructure recrystallizes under a predetermined condition, the internal corner defining a corner radius (R) that is greater than a critical corner radius below which an amount of internal residual stress in the single crystal microstructure exceeds the critical internal residual stress.

2. The cast component as recited in claim 1, wherein the internal cavity is a micropassage and wherein the maximum dimension width is less than about 15 mils.

3. The cast component as recited in claim 2, wherein the micropassage is embedded within an exterior wall of the cast body.

4. The cast component as recited in claim 3, wherein the cast body is an airfoil, and the exterior wall is a suction side wall or a pressure side wall of the airfoil.

5. The cast component as recited in claim 2, wherein the maximum dimension width is taken perpendicular to a longitudinal direction of the cast body and a ratio of the maximum dimension width (W) to the corner radius (R) is no greater than 10:1 (ten to one).

6. The cast component as recited in claim 2, wherein a ratio of the corner radius (R) to the maximum dimension width (W) is at least 1:10 (one to ten).

7. The cast component as recited in claim 1, wherein the internal corner is between a rib and an exterior wall of the cast body.

8. The cast component as recited in claim 1, wherein the cast body is a nickel-based alloy.

9. A turbine engine comprising:
a compressor section;
a combustor in fluid communication with the compressor section; and
a turbine section in fluid communication with the combustor, the turbine section including airfoil cast component having a cast body having a single crystal micro structure and an internal corner bounding an internal cavity wherein the internal cavity has a cross section (C) with a maximum dimension width (W) of less than about 20 mils, the single crystal microstructure defining a critical internal residual stress with respect to investment casting of the cast body using a refractory metal core beyond which the single crystal microstructure recrystallizes under a predetermined condition, the internal corner defining a corner radius (R) that is greater than a critical corner radius below which an amount of internal residual stress in the single crystal microstructure exceeds the critical internal residual stress.

10. The turbine engine as recited in claim 9, wherein the maximum dimension width is taken perpendicular to a longitudinal direction of the cast body, the longitudinal direction being perpendicular to a central engine axis of the turbine engine.

11. The turbine engine as recited in claim 10, wherein a ratio of the maximum dimension width (W) to the corner radius (R) is no greater than 10:1 (ten to one).

12. The turbine engine as recited in claim 10, wherein a ratio of the corner radius (R) to the maximum dimension width (W) is at least 1:10 (one to ten).

13. The turbine engine as recited in claim 9, wherein the internal corner is between a rib and an exterior wall of the cast body.

14. The turbine engine as recited in claim 9, further comprising a fan.

15. A method of limiting recrystallization in a cast body, the method comprising:
limiting recrystallization in the cast body having a single crystal microstructure by establishing an internal corner that bounds an internal cavity in the cast body to have a corner radius (R) that is greater than a critical corner radius with respect to investment casting of the cast body using a refractory metal core below which an amount of internal residual stress in the single crystal microstructure exceeds a critical internal residual stress from casting beyond which the single crystal microstructure recrystallizes under a predetermined condition.

16. The method as recited in claim 15, wherein the internal cavity is a micropassage.

17. The method as recited in claim 16, wherein the cast body is an airfoil, and the micropassage is embedded within an exterior wall of the airfoil.

18. The method as recited in claim 15, wherein the internal cavity has a cross section (C) with a maximum dimension width (W) that is less than about 15 mils.

* * * * *